(12) United States Patent
Kakushima et al.

(10) Patent No.: US 11,652,150 B2
(45) Date of Patent: May 16, 2023

(54) CHARGE TRAP EVALUATION METHOD AND SEMICONDUCTOR ELEMENT

(71) Applicant: SUMITOMO CHEMICAL COMPANY, LIMITED, Tokyo (JP)

(72) Inventors: Kuniyuki Kakushima, Yokohama (JP); Takuya Hoshii, Yokohama (JP); Hitoshi Wakabayashi, Yokohama (JP); Kazuo Tsutsui, Yokohama (JP); Hiroshi Iwai, Yokohama (JP); Taiki Yamamoto, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 111 days.

(21) Appl. No.: 16/641,129

(22) PCT Filed: Aug. 6, 2018

(86) PCT No.: PCT/JP2018/029483
§ 371 (c)(1),
(2) Date: Feb. 21, 2020

(87) PCT Pub. No.: WO2019/039256
PCT Pub. Date: Feb. 28, 2019

(65) Prior Publication Data
US 2020/0203493 A1    Jun. 25, 2020

(30) Foreign Application Priority Data
Aug. 24, 2017 (JP) .............................. JP2017-161603

(51) Int. Cl.
*H01L 27/01* (2006.01)
*H01L 29/423* (2006.01)
(Continued)

(52) U.S. Cl.
CPC ...... *H01L 29/4234* (2013.01); *G01R 31/2621* (2013.01); *H01L 29/0847* (2013.01); *H01L 29/778* (2013.01)

(58) Field of Classification Search
None
See application file for complete search history.

(56) References Cited

U.S. PATENT DOCUMENTS 6,777,753 B1 * 8/2004 Summers .............. H01L 27/092
257/350
8,003,981 B2    8/2011 Iwasaki et al.
(Continued)

FOREIGN PATENT DOCUMENTS

CN    101401213 A    4/2009
JP    2012-248753 A    12/2012
(Continued)

OTHER PUBLICATIONS

Boudou et al (Hysteresis I-V effects in short-Channel silicon Mosfet's), IEEE electron device Letters,VZol. EDL-8,No. 7, Jul. 1987.*
(Continued)

*Primary Examiner* — Ali Naraghi
(74) *Attorney, Agent, or Firm* — Foley & Lardner LLP

(57) ABSTRACT

Provided are a charge trap evaluation method and semiconductor device including, in an embodiment, a step for applying an initialization voltage that has the same sign as a threshold voltage and is greater than or equal to the threshold voltage between the source electrode 15 and drain electrode 16 of a semiconductor device 1 having an HEMT structure and the substrate 10 of the semiconductor device 1 and initializing a trap state by forcing out trapped charge from a trap level and a step for monitoring the current flowing between the source electrode 15 and drain electrode 16 after the trap state initialization and evaluating at least
(Continued)

one from among charge trapping, current collapse, and charge release.

16 Claims, 4 Drawing Sheets

(51) Int. Cl.
    *G01R 31/26*     (2020.01)
    *H01L 29/08*     (2006.01)
    *H01L 29/778*     (2006.01)

(56) References Cited

U.S. PATENT DOCUMENTS

| | | | |
|---|---|---|---|
| 11,415,546 B2* | 8/2022 | Johnson | H01L 51/0545 |
| 2003/0042543 A1* | 3/2003 | Hirano | H01L 29/78615 |
| | | | 257/E29.281 |
| 2009/0065771 A1 | 3/2009 | Iwasaki et al. | |
| 2010/0176837 A1* | 7/2010 | Kummel | G01N 27/4141 |
| | | | 257/253 |
| 2011/0256684 A1 | 10/2011 | Iwasaki et al. | |
| 2013/0114355 A1* | 5/2013 | Takeuchi | G11C 11/413 |
| | | | 365/189.16 |
| 2014/0138704 A1* | 5/2014 | Tanaka | H01L 29/66462 |
| | | | 257/76 |
| 2015/0087091 A1 | 3/2015 | Godo et al. | |
| 2015/0192635 A1* | 7/2015 | Kniazev | H01L 22/14 |
| | | | 324/762.01 |

FOREIGN PATENT DOCUMENTS

| | | |
|---|---|---|
| JP | 2013-015416 A | 1/2013 |
| JP | 2014-029908 A | 2/2014 |
| JP | 2017-143231 A | 8/2017 |

OTHER PUBLICATIONS

International Preliminary Report on Patentability issued in International Application No. PCT/JP2018/029483 dated Mar. 5, 2020 (13 pages).
Partial Supplementary European Search Report dated May 10, 2021 for corresponding European Patent Application No. 18847689.9.
Yoshioka et al., "Current Collapse Phenomena of GaN-HEMTs Caused By Vertical Electric Field on Conductive Substrate," Materials of IEICE Technical Meeting. EFM, Electronic Materials Technical Meeting, Nov. 30, 2007, EFM-07-18, pp. 15-19.
International Searching Authority, "International Search Report," issued in connection with International Patent Application No. PCT/JP2018/029483, dated Oct. 23, 2018.
International Searching Authority, "Written Opinion," issued in connection with International Patent Application No. PCT/JP2018/029483, dated Oct. 23, 2018.
European Extended Search Report, dated Sep. 10, 2021, issued in corresponding European Patent Application No. 18847689.9, (14 pages).
Tewksbury, et al., "The Effects of Oxide Traps on the Large-signal Transient Response of Analog MOS Circuits", IEEE Journal of Solid-State Circuits 24(2):542-544,(Apr. 1, 1989).
Office Action dated Sep. 7, 2021 issued in a corresponding Japanese Patent Application No. 2017-161603, (11 pages).
Office Action dated Jul. 28, 2021 issued in a corresponding Chinese Patent Application No. 201880054957.0, (21 pages).
Office Action issued in corresponding Chinese Patent Application No. 201880054957.0 dated Feb. 9, 2022.
Office Action issued in corresponding Taiwanese Patent Application No. 107128622 dated Apr. 11, 2022.

\* cited by examiner

CHARGE TRAP EVALUATION METHOD AND SEMICONDUCTOR ELEMENT

CROSS-REFERENCE TO RELATED APPLICATIONS

The present application claims priority under 37 U.S.C. § 371 to International Patent Application No. PCT/JP2018/029483, filed Aug. 6, 2018, which claims priority to and the benefit of Japanese Patent Application No. 2017-161603, filed on Aug. 24, 2017. The contents of these applications are hereby incorporated by reference in their entireties.

TECHNICAL FIELD

The present invention relates to a charge trap evaluation method and a semiconductor device.

BACKGROUND ART

As a problem to be solved for a so-called power semiconductor device, in particular, for a HEMT (High Electron Mobility Transistor), there is a phenomenon called as "current collapse" in which the on-resistance increases. When the current collapse occurs, on-loss increases, switching failure and the like may occur, which may cause deterioration of characteristics of the power semiconductor device. It is considered that the current collapse is generated by charge trapped in a trap level in a semiconductor layer or the like due to voltage stress applied to the OFF state of the HEMT. Here, "charge trap" means that not only electrons but also charges including holes are trapped. This is because hole trapping in addition to electron trapping are considered to affect the on-resistance.

As a conventional method for evaluating the current collapse, a method of applying voltage of 100 to 200V at which the current collapse can occur between two ohmic electrodes on a surface of the GaN-HEMT and a substrate, thereby evaluating a ratio of resistance values of the voltage between the two ohmic electrodes before and after the voltage application has been known (e.g., see Non-Patent Literature 1).

According to the method of Non-Patent Literature 1, since a vertical voltage is applied to the HEMT in order to generate a current collapse, the collapse due to the vertical electric field can be evaluated.

CITATION LIST

Patent Literature

Non-Patent Literature 1: YOSHIOKA Akira and 4 others, "Current Collapse Phenomena of GaN-HEMTs Caused By Vertical Electric Field on Conductive Substrates", Materials of IEICE Technical Meeting. EFM, Electronic Materials Technical Meeting, Nov. 30, 2007, EFM-07-18, pp. 15-19

SUMMARY OF INVENTION

Technical Problem

However, the method of Non-Patent Literature 1 has a problem that measurement reproducibility is low when a semiconductor device using a wide bandgap semiconductor having a deep trap level is used as a sample. For example, even if the samples are exactly the same, the measured values vary every time the measurement is performed.

It is an object of the present invention to provide a charge trap evaluation method for electrons and holes, which ensures the measurement reproducibility even for a semiconductor device using a wide bandgap semiconductor having a deep trap level, and makes it possible to evaluate the current collapse with high reproducibility, and a semiconductor device that can be evaluated with good reproducibility by the same method.

Solution to Problem

One embodiment of the present invention provides the following charge trap evaluation methods [1] to [5] and the semiconductor devices [6] to [8] to achieve the above object.

[1] A charge trap evaluation method, comprising:
a step for applying an initialization voltage having the same sign as a threshold voltage and a magnitude equal to or greater than the threshold voltage between a source electrode and a drain electrode of a semiconductor device having a lateral structure and a substrate of the semiconductor device and initializing a trap state by expelling a trapped charge from a trap level; and
a step for monitoring a current flowing between the source electrode and the drain electrode after the trap state initialization and evaluating at least one from among charge capture, current collapse, and charge release,
wherein the threshold voltage is a voltage applied between the source and drain electrodes and the substrate, and on-off state of channel current switches when the voltage is applied between the source electrode and the drain electrode.

[2] The charge trap evaluation method according to [1], wherein the charge capture is evaluated by evaluating the charge capture when the voltage applied between the source and drain electrodes and the substrate is changed from the initialization voltage to a stress voltage having the same sign as the threshold voltage and a magnitude equal to or less than the threshold voltage, after the trap state initialization.

[3] The charge trap evaluation method according to [2], wherein the current collapse is evaluated by changing the voltage between the source and drain electrodes and the substrate from the stress voltage to 0V, after the evaluation of the charge capture, and calculating a ratio of a current value immediately after the voltage becomes 0V to a saturated current value after a predetermined time has elapsed.

[4] The charge trap evaluation method according to [3], wherein the charge release is evaluated by evaluating the charge release when the voltage between the source and drain electrodes and the substrate is changed from 0V to the stress voltage after the evaluation of the current collapse.

[5] The charge trap evaluation method according to any one of [1] to [4], wherein the semiconductor device includes a semiconductor layer having a bandgap of 2.5 eV or more.

[6] A semiconductor device with a lateral structure, comprising:
a substrate;
a semiconductor layer on the substrate; and
a source electrode and a drain electrode which are connected to the semiconductor layer,
wherein a trapped charge can be expelled from a trap level and a trap state can be initialized by applying a voltage having the same sign as a threshold voltage and a magnitude equal to or greater than the threshold voltage.

[7] The semiconductor device according to [6], wherein the semiconductor layer has a bandgap of 2.5 eV or more.

[8] A semiconductor device with a lateral structure, comprising:

a substrate;

a semiconductor layer on the substrate; and a source electrode and a drain electrode which are connected to the semiconductor layer, wherein in a curve showing a relationship between a voltage applied between the source and drain electrodes and a substrate and a current flowing between the source electrode and the drain electrode, a voltage in a range where hysteresis is observed is applied to the substrate as a stress voltage, a time rate of change of a value of the current when the stress voltage is released is 10% or less.

Advantageous Effects of Invention

According to the present invention, it is possible to provide a charge trap evaluation method capable of ensuring measurement reproducibility even for a semiconductor device using a wide bandgap semiconductor having a deep trap level and performing a current collapse evaluation with good reproducibility, and a semiconductor device which can be evaluated with good reproducibility by the same method.

DESCRIPTION OF EMBODIMENT

The inventors have contemplated that there is some disturbance factor in the initial state of measurement with respect to the problem of low measurement reproducibility in the current collapse evaluation of a semiconductor device using a wide bandgap semiconductor represented by HEMT. As a result of intensive studies, the inventors assumed that the wide bandgap semiconductor has a deep trap level, so that it would be difficult to reach a complete thermal equilibrium state, and that the charge trap state during measurement would vary. Therefore, a method for initializing the charge trap state before the measurement was examined.

Conventionally, there have been known methods of initializing a trap state by irradiating light or heating on a sample of a semiconductor device. Methods of initializing the trap state after measuring the trap state have been also known. However, with these methods, it is difficult to initialize the trap state of semiconductor devices including wide bandgap semiconductors before measuring the trap state. In addition, since a light irradiation or heating step and an equipment therefor are required separately from the step of applying a voltage, the number of steps and the number of devices increase.

Therefore, the inventors achieved the solution for the above problem by applying a voltage having the same sign as a threshold voltage and a magnitude equal to or greater than the threshold voltage in a pre-process of trap state measurement by voltage application, and expelled trapped charges from the trap level to change the trap state, thereby initializing the trap state (ideally, releasing all trapped charges from the trap level). Further, according to the semiconductor device which is most suitable for evaluation using the trap charge evaluation method including the above-described steps, quality variation can be reduced, so that the yield rate of non-defective products is increased, and finally the production yield can be improved.

Still further, the same effect as the above-described semiconductor device can be obtained by providing a semiconductor device in which a time rate of change of the value of the current flowing between the source electrode and the drain electrode is set in a specific range, when the voltage is applied between the source and drain electrodes and the substrate using the above-described trap charge evaluation method.

(Semiconductor Device 1)

Figure 1:
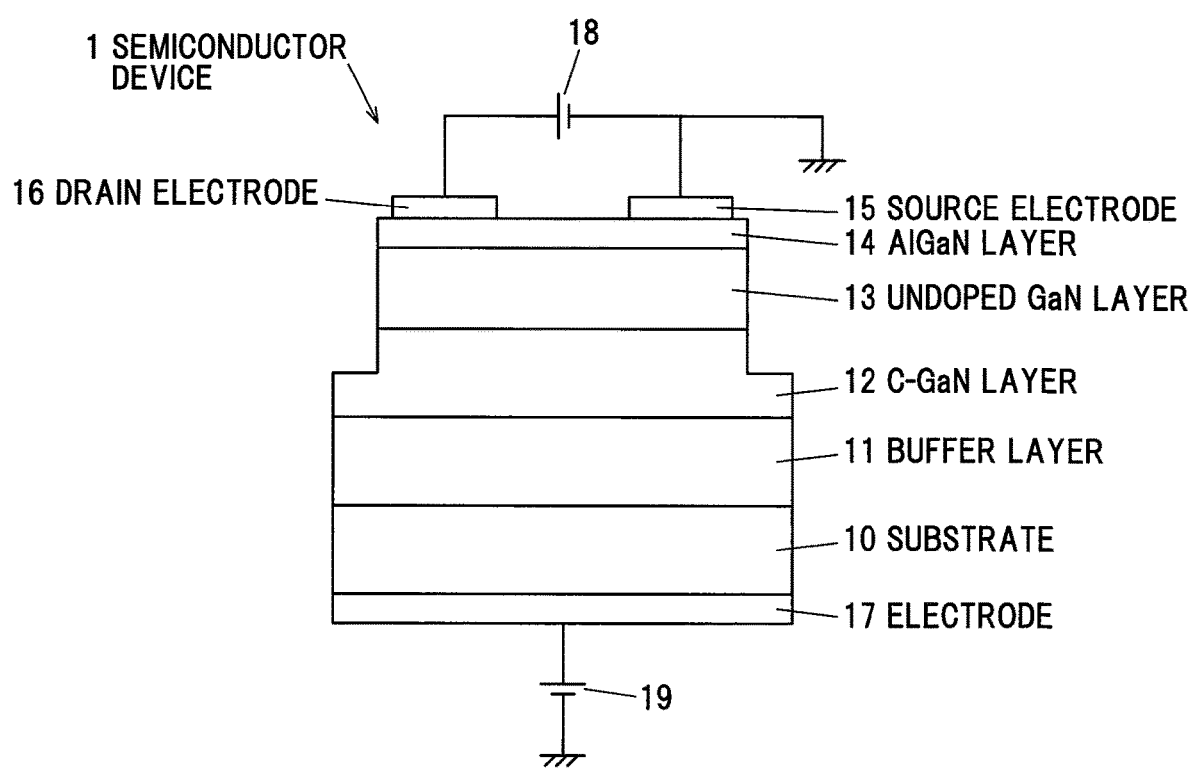
FIG. 1 is a vertical sectional view of an example of a semiconductor device having a structure suitable for evaluation by the charge trap evaluation method according to the present embodiment.

FIG. 1 is a vertical sectional view of a semiconductor device 1 which is an example of a semiconductor device having a structure suitable for evaluation by the charge trap evaluation method according to the present embodiment.

The semiconductor device 1 includes a substrate 10 made of a semiconductor such as Si, a buffer layer 11 made of a plurality of semiconductor layers such as AlN and AlGaN laminated on the substrate 10 in order, a first nitride semiconductor layer 12 made of a nitride semiconductor such as GaN doped with impurities, a second nitride semiconductor layer 13 to which impurities are not added, a third nitride semiconductor layer 14 made of AlGaN or the like, and a source electrode 15 and a drain electrode 16 that are connected to a surface (opposite surface with respect to the second nitride semiconductor layer 13) of the third nitride semiconductor layer 14, and an electrode 17 connected to a back surface of the substrate 10 (opposite surface with respect to the buffer layer 11).

The first nitride semiconductor layer 12 is a layer made of a GaN film to which, e.g., C (carbon) is added as an impurity, and the second nitride semiconductor layer 12b is a layer made of, e.g., (an undoped) GaN film to which no impurity is added. The third nitride semiconductor layer 14 is a layer made of, e.g., AlGaN.

The source electrode 15 and the drain electrode 16 are, e.g., linear electrodes having a width $W_{mes}$ of about several tens μm to several hundred μm, e.g., and an interval $L_{gap}$ between the source electrode 15 and the drain electrode 16 is about several tens μm to several hundred μm. The electrode 17 may be formed on, for example, the entire back surface of the substrate 10. As an example, each of the source electrode 15 and the drain electrode 16 has a laminated structure composed of a plurality of metals such as Ti/Al/Ni/Au, and the electrode 17 has a laminated structure composed of a plurality of metals such as Ni/Au.

The voltage can be applied between the source electrode 15 and the drain electrode 16 by a DC power supply 18. Thereby, a channel current is flown between the source electrode 15 and the drain electrode 16 through two-dimensional electron gas in vicinity of an interface between the second nitride semiconductor layer 13 and the third nitride semiconductor layer 14, in the second nitride semiconductor layer 13.

The channel current $I_{ch}$ is a current flowing between the source electrode 15 and the drain electrode 16 when a constant (e.g., 1V) voltage is applied between the source electrode 15 and the drain electrode 16 by the DC power supply 18.

The voltage can be applied between the source and drain electrodes 15, 16 and the substrate 10 by a DC power supply 19.

A substrate voltage $V_B$ is a voltage applied between the source and drain electrodes 15, 16 and the substrate 10 by the DC power supply 19, and it has a positive value when the source electrode 15 and the drain electrode 16 have a low potential and the substrate 10 has a high potential. Takes a positive value.

In this embodiment, the semiconductor device 1 has a HEMT structure, but when used as a sample, a gate electrode, between a source electrode and a drain electrode, which is unnecessary for charge trap evaluation is omitted from a normal three-terminal HEMT, and an electrode is further provided on the back surface of the substrate. Note that the semiconductor device 1 may have a gate electrode.

(Charge Trap Evaluation Method)

Figure 2:
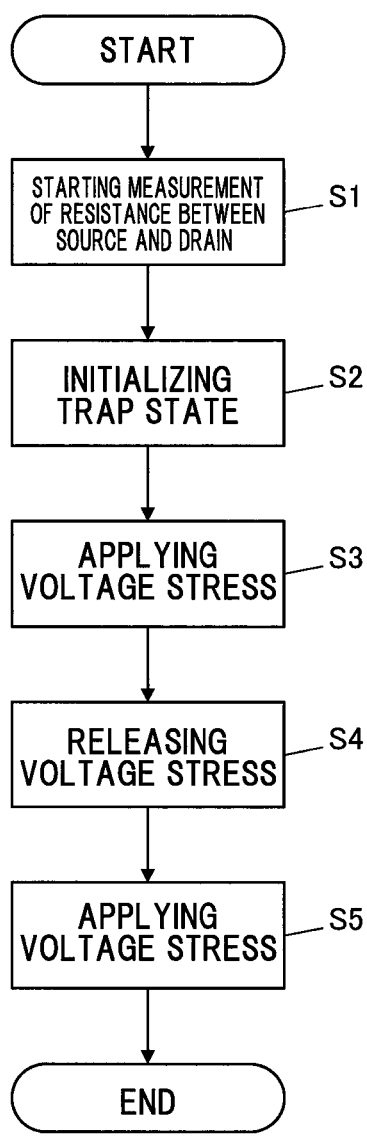
FIG. 2 is a flowchart showing a flow of the charge trap evaluation method according to the present embodiment.

FIG. 2 is a flowchart showing a flow of the charge trap evaluation method according to the present embodiment. Hereinafter, the charge trap evaluation method will be described with reference to the flowchart of FIG. 2. In the present embodiment, the following steps are performed under a constant temperature condition (e.g., 100° C.) in order to reduce disturbance factors of the measured value.

First, a constant voltage is applied between the source electrode 15 and the drain electrode 16 by the DC power supply 18, and the current $I_{ch}$ flowing between the source electrode 15 and the drain electrode 16 is monitored (Step S1).

Next, a voltage having the same sign as the threshold voltage $V_{th}$ and a magnitude equal to or higher than the threshold voltage $V_{th}$ (referred to as "an initialization voltage $V_i$,") is applied between the source and drain electrodes 15, 16 and the substrate 10 by the DC power supply 19. Then, the trapped state is initialized by expelling the charges trapped in the trap levels of the buffer layer 11, the first nitride semiconductor layer 12, and the second nitride semiconductor layer 13 (Step S2).

The value of the initialization voltage $V_i$; will be described later, but the voltage application time can be arbitrarily set based on the overall structure, the threshold voltage, the composition of each layer, and the like of the device. As an example, the initialization voltage may be set to be applied for one minute but is not limited thereto. For example, the voltage may be applied in a range from 1 second to 60 minutes.

The threshold voltage $V_{th}$ is a voltage applied between the source and drain electrodes 15, 16 and the substrate 10, and is a voltage at which the channel current $I_{ch}$ between the source electrode 15 and the drain electrode 16 is switched on and off when the voltage is applied between the source electrode 15 and the drain electrode 16.

Next, a voltage (stress voltage $V_s$) having the same sign as the threshold voltage $V_{th}$ and a magnitude less than or equal to the threshold voltage Vth is applied between the source and drain electrodes 15, 16 and the substrate 10 by the DC power supply 19, so that a voltage stress is applied (step S3).

In the semiconductor device 1, when the threshold voltage $V_{th}$, is, e.g., −700V, the stress voltage $V_s$ can be set to −700V or more, typically −600 to −100V. However, the stress voltage $V_s$ is not limited to a negative voltage but can be a positive voltage. Further, the numerical range of stress voltage $V_s$ can be set based on a voltage region where hysteresis is observed in a substrate voltage $V_B$-channel current $I_{ch}$ curve described later.

By applying the stress voltage $V_s$, charges are trapped so as to reach a quasi-equilibrium state in a state where the stress voltage $V_s$ is applied. At this time, the charge trap can be monitored from the change in the current flowing between the source electrode 15 and the drain electrode 16.

After the trap state has been initialized, in order to prevent the charges from being trapped again before moving to the step S2, it is preferable that the steps S1 and S2 are continuously performed that is, the substrate voltage $V_B$ is switched from the initialization voltage $V_i$ directly to the stress voltage $V_s$.

Next, the substrate voltage $V_B$ is set to 0V, and the charge trap is evaluated by calculating the ratio between the current value immediately after the substrate voltage $V_B$ becomes 0V and the saturated current value after a certain period of time (Step S4).

Next, the stress voltage $V_s$ is applied between the source and drain electrodes 15, 16 and the substrate 10 by the DC power supply 19 again, that is, the voltage stress is applied with using the substrate voltage $V_B$ as the stress voltage $V_s$ (Step S5).

At this time, the trapped charge is released when the voltage $V_B$ is set to 0V, so that the charge release can be monitored from the change in the current $I_{ch}$ flowing between the source electrode 15 and the drain electrode 16.

According to the present embodiment, the charge trap when the stress voltage is applied is evaluated in the step S3, and the charge trap in the state where the stress voltage is not applied (voltage $V_B$ is 0V) after the stress voltage has been applied is evaluated in the step S4 (That is, the current collapse is evaluated), then the charge release at the time of applying the stress voltage in the step S5 can be evaluated.

Note that it is assumed that in the conventional charge trap evaluation method that does not include the trap state initialization step (step S2) of the present embodiment, the measurement reproducibility in the current collapse evaluation is low and the accuracy and stability of the evaluation of charge release are poor because the dispersion of the initial state of measurement is large. This is presumably because the wide bandgap semiconductor has a deep trap level, so that it is difficult to reach a perfect thermal equilibrium state, and the state of the charge trap at the time of measurement varies from device to device.

Therefore, it can be said that the semiconductor device 1 suitable for the charge trap evaluation method of the present embodiment is a semiconductor device having a horizontal structure, which includes a substrate 10, semiconductor layers 11 to 14 on the substrate 10, and a source electrode 15 and a drain electrode 16 which are connected to the semiconductor layers 11 to 14, in which trapped charges can be expelled from a trap level by applying a stress voltage $V_s$ having the same sign as a threshold voltage $V_{th}$ and a magnitude equal to or higher than the threshold voltage $V_{th}$ between the source electrode 15 and the drain electrode 16 and the substrate 10, thereby the trap state can be initialized.

Alternatively, the semiconductor device 1 may be a semiconductor device which includes a substrate 10, semiconductor layers 11 to 14 on the substrate 10, and a source electrode 15 and a drain electrode 16 which are connected to the semiconductor layers 11 to 14, in which in a curve showing a relationship between a substrate voltage $V_B$ applied between the source and drain electrode, 15, 16 and a substrate electrode 19 and a current $I_{ch}$ flowing between the source electrode 15 and the drain electrode 16, a voltage in a range where hysteresis is observed is applied to the substrate 10 as the stress voltage $V_s$, a time rate of change of the value of the current $I_{ch}$ when the stress voltage $V_s$ is released is, e.g., 10% or less, preferably 5% or less, more preferably 2% or less, and still more preferably 1%.

EXAMPLES

Figure 3:
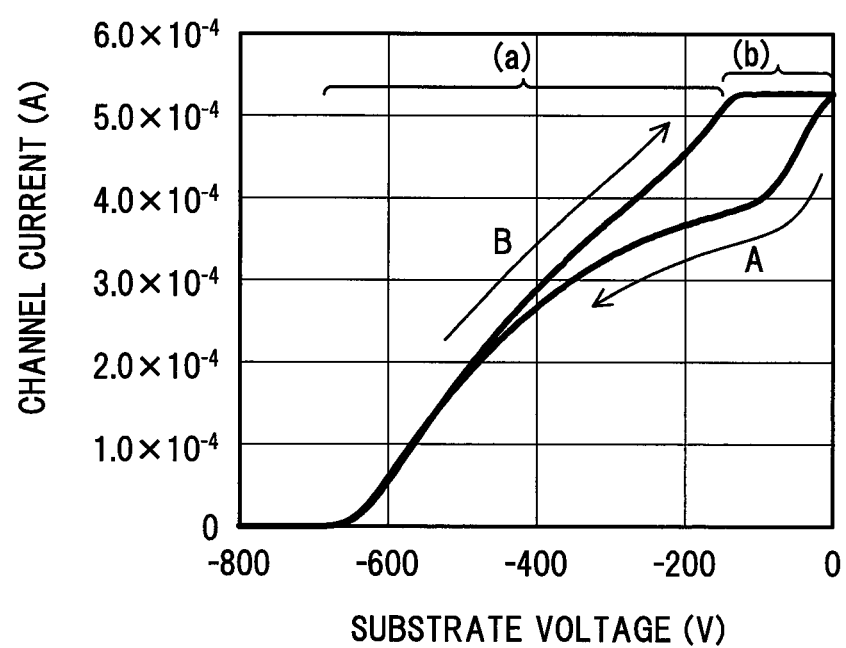
FIG. 3 is a graph showing a relationship between a voltage applied between source and drain electrodes and a substrate and a channel current flowing between the source electrode and the drain electrode in the example of the present invention.

FIG. 3 is a graph showing the relationship between the substrate voltage $V_B$ applied between the source and drain electrodes 15, 16 and the substrate 10 and the channel current $I_{ch}$ flowing between the source electrode 15 and the drain electrode 16 in the embodiment of the present invention.

In the example, the semiconductor device 1 having the structure shown in FIG. 1 was used as a sample for the charge trap evaluation method. Specifically, the semiconductor device 1 included a Si substrate 10, a buffer layer 11 made of an AlN layer and an AlGaN layer sequentially laminated on the substrate 10, a C-doped GaN layer 12, an undoped GaN layer 13, an AlGaN layer 14, a source electrode 15 having a Ti/Al/Ni/Au laminated structure connected to the surface (the surface opposite to the undoped GaN layer 13) of the AlGaN layer 14, and a drain electrode 16 having a Ti/Al/Ni/Au laminated structure, and an electrode 17 having a Ni/Au laminated structure connected to the back surface (the surface opposite to the buffer layer 11) of the substrate 10. The source electrode 15 and the drain electrode 16 were linear electrodes having a width $W_{mesa}$ of 100 µm, and an interval $L_{gap}$ between the source electrode 15 and the drain electrode 16 was 120 µm. The electrode 17 was formed on the entire back surface of the substrate 10.

In this example, the steps S1 to S5 of the charge trap evaluation method were performed under a temperature condition of 100° C.

FIG. 3 shows that the channel current $I_{ch}$ starts to flow when the substrate voltage $V_B$ is about −700V in the semiconductor device 1 of the embodiment, and the threshold voltage $V_{th}$ is −700V (the magnitude of the threshold voltage $V_{th}$ is 700V). For this reason, the initialization voltage $V_i$ is −700V or less, in other words, it has the same sign as the threshold voltage $V_{th}$ and the magnitude of 700V or more.

In FIG. 3, an arrow A indicates a curve when the substrate voltage $V_B$ is changed from 0V in the minus direction, and an arrow B indicates a curve when the substrate voltage $V_B$ is changed from the threshold voltage $V_{th}$ in the plus direction. The curves have different shapes. As shown by the arrow A, when the substrate voltage $V_B$ is changed from 0V in the minus direction, it takes time until the trap charge is released from the defect level in the GaN layer, and the current value of the two-dimensional electron gas decreases during a period until the charge is released.

On the other hand, since the trap charge is released when the substrate voltage $V_B$ reaches the threshold voltage $V_{th}$, when the substrate voltage $V_B$ is changed from the threshold voltage $V_{th}$ in the plus direction as shown by the arrow B, the trap charge does not affect the current value of the two-dimensional electron gas. The curve thus becomes a hysteresis curve. Further, in the curve shown by the arrow B, it is assumed that the undoped GaN layer 13 is depleted in the range (a) and the neutral region exists in the undoped GaN layer 13 in the range (b).

In the semiconductor device 1 of the present embodiment, the threshold voltage $V_{th}$ is −700V, so that the stress voltage $V_s$ is set to −700V or more, typically −600 to −100V. However, the stress voltage $V_s$ is not limited to a negative voltage but may be a positive voltage. Further, the numerical range of stress voltage $V_s$ can be set based on the voltage region where the hysteresis is observed (the hysteresis region of the curve indicated by arrow B) in the substrate voltage $V_B$-channel current $I_{ch}$ curve of FIG. 3.

When the charge trap and the charge release were monitored based on the change in the current $I_{ch}$ flowing between the source electrode 15 and the drain electrode 16, the time constant $\tau_{fill}$ of charge capture in this embodiment was 1.3 seconds, and the constant $\tau_{release}$ was 2.0 seconds.

Figure 4A:
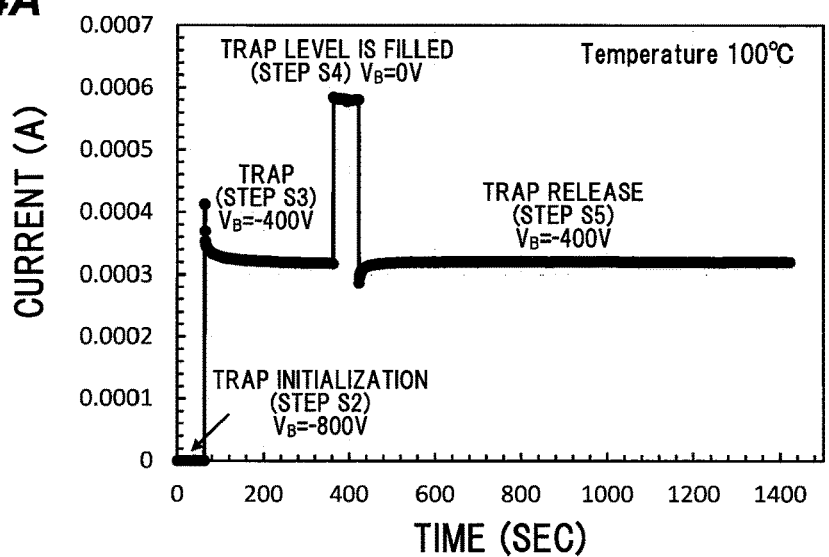
FIG. 4A is a graph showing a channel current flowing between the source electrode and the drain electrode during steps S2 to S5 in the embodiment of the present invention.
Figure 4B:
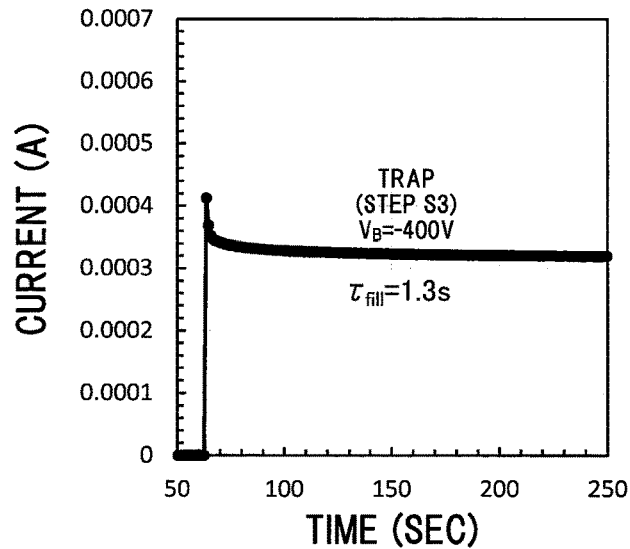
FIG. 4B is a graph in which a part of FIG. 4A is enlarged.
Figure 4C:
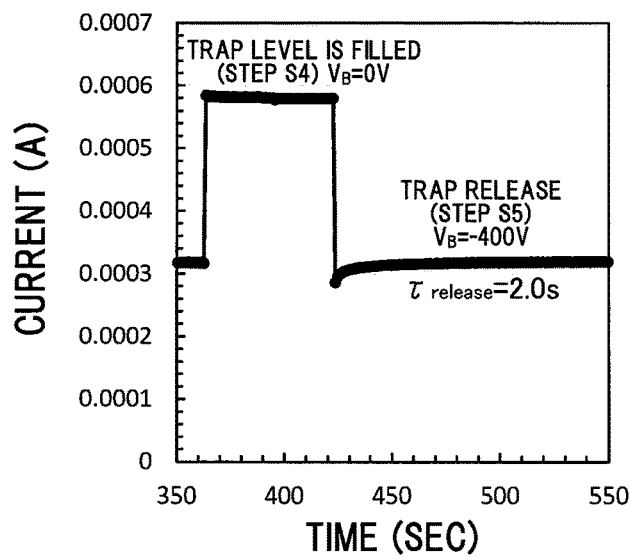
FIG. 4C is a graph in which a part of FIG. 4A is enlarged.

FIG. 4A is a graph showing the current flowing between the source electrode 15 and the drain electrode 16 during the steps S2 to S5, where the monitoring was started in the step S1 of the embodiment. FIGS. 4B and 4C are graphs each showing an enlarged part of FIG. 4A. Here, the stress voltage $V_s$ was set to −400V based on the voltage region where hysteresis was observed in the substrate voltage $V_B$-channel current $I_{ch}$ curve of FIG. 3.

As is clearly understood from FIG. 4A, the current value immediately after switching the voltage value from −800 V to −400 V is 4.09 $e^{-4}$A, and the current value at 100 seconds after the switching is 3.17 $e^{-4}$A. Therefore, the time rate of change of the current value from the stable time is 29%.

Next, the current value immediately after switching the voltage value from −400V to 0V is 5.84 $e^{-4}$A, and the current value at 50 seconds after the switching is 5.79 $e^{-4}$A. Therefore, the time rate of change of the current value is 1%.

Further, the current value immediately after switching the voltage value again from 0V to −400V is 2.85 $e^{-4}$A, and the current value at 100 seconds after the switching is 3.18 $e^{-4}$A. Therefore, the time rate of change of the current value is 10%. The time rate of change of the current value is preferably small, e.g., 10% or less, preferably 5% or less, more preferably 2% or less, and further preferably 1%.

Effects of Embodiment

According to the charge trap evaluation method of the above embodiment, a state in which a trap state is initialized by application of a high voltage is set as an initial state of the trap evaluation. Therefore, the variation in electric resistance between the source electrode-drain electrode in respective measurements is small, and the trap evaluation can be performed with good reproducibility.

According to the charge trap evaluation method of the above embodiment, it is possible to perform trap evaluation with good reproducibility even when applied to a semiconductor device including a wide bandgap semiconductor that has a deep trap level and is hard to reach a perfect thermal equilibrium state.

Also, in the trap state initialization step, no special steps and equipment such as light irradiation and heating are required, so that the number of steps and the number of apparatuses can be reduced.

For this reason, as the semiconductor device to which the charge trap evaluation method of the above embodiment is applied, it is considered that a wide bandgap semiconductor having a deep trap level, e.g., a HEMT including a semiconductor layer having a bandgap of 2.5 eV or more is preferable, and the highest effect would be obtained. However, the invention is not necessarily limited to the HEMT.

Further, as the semiconductor device to which the charge trap evaluation method of the above embodiment is applied, since this method can be used for a device whose drain current is changed by applying a voltage from the substrate (back gate), a semiconductor device having a lateral structure other than HEMT (an electronic device having a lateral conduction direction) can also be suitably implemented.

Further, for example, the layer configuration and compositions of the semiconductor layers are not particularly limited. Further, the material of the source electrode and the drain electrode is not particularly limited as long as the material can be used to form an ohmic electrode. The material of the electrode on the back surface of the substrate is not particularly limited, and the electrode on the back surface of the substrate is unnecessary when the substrate is used as an electrode.

Although the embodiments of the present invention have been described above, the present invention is not limited to the above-described embodiments, and various modifications can be made without departing from the gist of the invention.

Further, the embodiments described above do not limit the invention according to the claims. Also, it should be noted that not all combinations of the features described in the embodiments are necessarily indispensable as means for solving the problems of the invention.

INDUSTRIAL APPLICABILITY

The present invention provides a charge trap evaluation method which ensures the measurement reproducibility even for a semiconductor device using a wide bandgap semiconductor having a deep trap level, and makes it possible to evaluate the current collapse with high reproducibility, and a semiconductor device that can be evaluated with good reproducibility by the same method.

REFERENCE SIGNS LIST

1 Semiconductor device
10 Substrate
11 Buffer layer
12 C-GaN layer
13 Undoped GaN layer
14 AlGaN layer
15 Source electrode
16 Drain electrode
17 Electrode

The invention claimed is:

1. A charge trap evaluation method, comprising:
applying an initialization voltage having the same sign as a threshold voltage and a magnitude equal to or greater than the threshold voltage between a source electrode and a drain electrode, which are on a first side of a substrate of a semiconductor device having a lateral structure, and a second side of the substrate of the semiconductor device and initializing a trap state by expelling a trapped charge from a trap level; and
monitoring a current flowing between the source electrode and the drain electrode after the trap state initialization and evaluating at least one from among charge capture, current collapse, and charge release,
wherein the second side of the substrate is opposite to the first side of the substrate, the threshold voltage is a voltage applied between the source and drain electrodes and the second side of the substrate, and on-off state of channel current switches when the voltage is applied between the source electrode and the drain electrode,
wherein the semiconductor device does not include a gate electrode.

2. The charge trap evaluation method according to claim 1, wherein the evaluating comprises evaluating the charge capture by changing the voltage applied between the source and drain electrodes and the second side of the substrate from the initialization voltage to a stress voltage having the same sign as the threshold voltage and a magnitude equal to or less than the threshold voltage, after the trap state initialization.

3. The charge trap evaluation method according to claim 2, wherein the current collapse is evaluated by changing the voltage between the source and drain electrodes and the second side of the substrate from the stress voltage to 0V, after the evaluation of the charge capture, and calculating a ratio of a current value immediately after the voltage becomes 0V to a saturated current value after a predetermined time has elapsed.

4. The charge trap evaluation method according to claim 3, wherein the evaluating comprises evaluating the charge release by changing the voltage between the source and drain electrodes and the second side of the substrate from 0V to the stress voltage after the evaluation of the current collapse.

5. The charge trap evaluation method according to claim 4, wherein the semiconductor device includes a semiconductor layer having a bandgap of 2.5 eV or more, the semiconductor layer is on the first side of the substrate and the source electrode and the electrode are on the semiconductor layer opposite to the substrate.

6. The charge trap evaluation method according to claim 3, wherein the semiconductor device includes a semiconductor layer having a bandgap of 2.5 eV or more, the semiconductor layer is on the first side of the substrate and the source electrode and the electrode are on the semiconductor layer opposite to the substrate.

7. The charge trap evaluation method according to claim 2, wherein the semiconductor device includes a semiconductor layer having a bandgap of 2.5 eV or more, the semiconductor layer is on the first side of the substrate and the source electrode and the electrode are on the semiconductor layer opposite to the substrate.

8. The charge trap evaluation method according to claim 1, wherein the semiconductor device includes a semiconductor layer having a bandgap of 2.5 eV or more, the semiconductor layer is on the first side of the substrate and the source electrode and the electrode are on the semiconductor layer opposite to the substrate.

9. The charge trap evaluation method according to claim 1, wherein the evaluating comprises evaluating the charge capture.

10. The charge trap evaluation method according to claim 1, wherein the evaluating comprises evaluating the charge collapse.

11. The charge trap evaluation method according to claim 1, wherein the evaluating comprises evaluating the charge release.

12. The charge trap evaluation method according to claim 1, wherein the semiconductor further comprises a substrate electrode in direct contact with the second side of the substrate and the initialization voltage is applied to the second side of the substrate through the substrate electrode.

13. A semiconductor device with a lateral structure, comprising:
a substrate having a first side and a second side opposite to the first side;
a semiconductor layer on the first side of the substrate;
a source electrode and a drain electrode on the semiconductor layer opposite to the substrate,
a first voltage source configured to apply a first voltage to the source electrode and the drain electrode and
a second voltage source configured to apply a second voltage having the same sign as a threshold voltage and a magnitude equal to or greater than the threshold voltage to the second side of the substrate;

wherein a trapped charge can be expelled from a trap level and a trap state can be initialized by applying the second voltage having the same sign as the threshold voltage and the magnitude equal to or greater than the threshold voltage to the second side of the substrate.

14. The semiconductor device according to claim 13, wherein the semiconductor layer has a bandgap of 2.5 eV or more.

15. The semiconductor device according to claim 13 further comprises a substrate electrode in direct contact with the second side of the substrate and wherein the second voltage source configured to apply the second voltage to the second side of the substrate through the substrate electrode.

16. The semiconductor device according to claim 13, wherein the device does not include a gate electrode.

\* \* \* \* \*